United States Patent
Seo

(10) Patent No.: US 11,105,861 B2
(45) Date of Patent: Aug. 31, 2021

(54) DEVICE AND METHOD FOR ESTIMATING BATTERY RESISTANCE

(71) Applicant: LG CHEM, LTD., Seoul (KR)

(72) Inventor: Bo-Kyung Seo, Daejeon (KR)

(73) Assignee: LG Chem, Ltd., Seoul (KR)

( * ) Notice: Subject to any disclaimer, the term of this patent is extended or adjusted under 35 U.S.C. 154(b) by 162 days.

(21) Appl. No.: 16/498,018

(22) PCT Filed: Nov. 15, 2018

(86) PCT No.: PCT/KR2018/014037
§ 371 (c)(1),
(2) Date: Sep. 26, 2019

(87) PCT Pub. No.: WO2019/098722
PCT Pub. Date: May 23, 2019

(65) Prior Publication Data
US 2021/0103001 A1    Apr. 8, 2021

(30) Foreign Application Priority Data

Nov. 17, 2017 (KR) .................. 10-2017-0154009

(51) Int. Cl.
*G01R 31/389* (2019.01)
*G01R 31/392* (2019.01)
(Continued)

(52) U.S. Cl.
CPC ......... *G01R 31/389* (2019.01); *G01R 31/367* (2019.01); *G01R 31/388* (2019.01); *G01R 31/392* (2019.01); *H01M 10/486* (2013.01)

(58) Field of Classification Search
CPC .. G01R 31/389; G01R 31/392; G01R 31/388; G01R 31/367; H01M 10/486
See application file for complete search history.

(56) References Cited

U.S. PATENT DOCUMENTS

2004/0150406 A1    8/2004   Laig-Hoerstebrock
2006/0120422 A1*   6/2006   Yamanishi .......... H01S 5/34313
                                                      372/43.01
(Continued)

FOREIGN PATENT DOCUMENTS

CN    1780032 A   *  5/2006   ............. Y02E 60/10
CN    103345163 A *  10/2013  ............. G05B 17/02
(Continued)

OTHER PUBLICATIONS

S. Goswami, Side gate tunable Josephson junctions at the LaAIO3/SrTiO3 interface, Jan. 19, 2017, 8 pages (Year: 2017).*
(Continued)

*Primary Examiner* — Tung S Lau
(74) *Attorney, Agent, or Firm* — Morgan, Lewis & Bockius LLP

(57) ABSTRACT

Disclosed is a battery resistance estimation apparatus. The battery resistance estimation apparatus according to the present disclosure includes a memory unit to store a resistance lookup table in which resistance data is recorded according to a state of charge-temperature (SOC-T) condition of a battery, and a control unit, wherein the control unit includes a resistance accumulation calculation unit to measure I-V data while the battery is charged/discharged, calculate resistance by dV/dI repeatedly on a periodic basis and store the resistance in the memory unit, wherein the resistance is accumulated and stored by the SOC-T condition, and a resistance data update unit to calculate a weighted average of new resistance data and previously stored resistance data and update resistance data corresponding to a corresponding SOC-T condition to the weighted average, wherein the new resistance data is one of an average of the resistance data stored in the memory unit by the SOC-T
(Continued)

condition, an average of maximum and minimum, and a maximum.

10 Claims, 3 Drawing Sheets

(51) Int. Cl.
*G01R 31/388* (2019.01)
*G01R 31/367* (2019.01)
*H01M 10/48* (2006.01)

(56) References Cited

U.S. PATENT DOCUMENTS

| | | | |
|---|---|---|---|
| 2006/0158155 A1* | 7/2006 | Tamezane | G01R 31/367 320/132 |
| 2006/0171194 A1* | 8/2006 | Lowrey | H01L 27/2427 365/154 |
| 2006/0176022 A1 | 8/2006 | Namba | |
| 2006/0227590 A1* | 10/2006 | Parkinson | G11C 13/0004 365/148 |
| 2006/0227591 A1* | 10/2006 | Lowrey | G11C 16/3431 365/148 |
| 2008/0169819 A1 | 7/2008 | Ishii | |
| 2009/0109046 A1* | 4/2009 | Gielniak | G01R 31/392 340/636.12 |
| 2010/0042345 A1 | 2/2010 | Kang et al. | |
| 2010/0203263 A1* | 8/2010 | Czubatyj | C23C 14/24 427/596 |
| 2010/0203709 A1* | 8/2010 | Czubatyj | H01L 45/04 438/478 |
| 2011/0097624 A1* | 4/2011 | Bhatt | H01M 4/60 429/163 |
| 2011/0109273 A1 | 5/2011 | Tamezane | |
| 2013/0041538 A1 | 2/2013 | Jin et al. | |
| 2015/0070024 A1 | 3/2015 | Kim et al. | |
| 2016/0054390 A1 | 2/2016 | Lin et al. | |
| 2016/0088563 A1 | 3/2016 | Koo et al. | |
| 2017/0133577 A1* | 5/2017 | Cybart | H01L 39/2493 |

FOREIGN PATENT DOCUMENTS

| | | | | |
|---|---|---|---|---|
| CN | 105738815 A | * | 7/2016 | |
| CN | 106226699 A | | 12/2016 | |
| CN | 107064815 A | | 8/2017 | |
| CN | 108110224 A | * | 6/2018 | H01M 4/505 |
| FR | 2925168 A1 | * | 6/2009 | G01R 31/367 |
| GB | 2461350 A | | 1/2010 | |
| JP | H08-214469 A | | 8/1996 | |
| JP | 2006-215001 A | | 8/2006 | |
| JP | 2007-048628 A | | 2/2007 | |
| JP | 2008-256673 A | | 10/2008 | |
| JP | 2011-103748 A | | 5/2011 | |
| JP | 5297751 B2 | | 9/2013 | |
| JP | 2014-211307 A | | 11/2014 | |
| JP | 5694088 B2 | | 4/2015 | |
| KR | 10-2007-0077871 A | | 7/2007 | |
| KR | 10-0927541 B1 | | 11/2009 | |
| KR | 10-2015-0029204 A | | 3/2015 | |
| KR | 10-2016-0033588 A | | 3/2016 | |

OTHER PUBLICATIONS

P. Monceau, Charge-density-wave motion in NbSe3. I. Studies of the differential resistance dV/dl, Jan. 15, 1982, 17 pages (Year: 1982).*
S. Urazhdin, Oct. 3, 2003, Current-Driven Magnetic Excitations in Permalloy-Based Multilayer Nanopillars, 4 pages (Year: 2003).*
Peng Xiong, Subgap and Above-Gap Differential Resistance Anomalies in Superconductor—Normal-Metal Microjunctions, Sep. 20, 1993, 5 pages (Year: 1993).*
C. Strunk, Resistance anomalies in superconducting mesoscopic Al structures, May 1, 1998, 13 pages (Year: 1998).*
Vitali Savuskan, Selecting Single Photon Avalanche Diode (SPAD) Passive-Quenching Resistance: An Approach, IEEE Sensors Journal, vol. 13, No. 6, Jun. 2013, 7 pages (Year: 2013).*
International Search Report dated Mar. 11, 2019, issued in corresponding International Patent Application No. PCT/KR2018/014037.
Office Action dated Feb. 3, 2021, issued in corresponding Chinese Patent Application No. 201880019674.2.
Liu Feng, et al., "Affect of Temperature on Silicon Solar Cell Parameters," Acta Energiae Solaris Sinica, vol. 33, No. 7, Jul. 2012, pp. 1155-1157. (English language abstract).
Office Action dated Oct. 6, 2020, issued in corresponding Japanese Patent Application No. 2019-551571.
Office Action dated Dec. 19, 2020, issued in corresponding Korean Patent Application No. 10-2017-0154009.
Korean Office Action dated Jun. 23, 2020, issued in corresponding KR Patent Application No. 10-2017-0154009.

* cited by examiner

DEVICE AND METHOD FOR ESTIMATING BATTERY RESISTANCE

TECHNICAL FIELD

The present disclosure relates to an apparatus and method for estimating resistance that is one of factors indicating a State Of Health (SOH) of a battery. The present application claims priority to Korean Patent Application No. 10-2017-0154009 filed in the Republic of Korea on Nov. 17, 2017, the disclosure of which is incorporated herein by reference.

BACKGROUND ART

Batteries can be recharged repeatedly, and they are gaining attention as an alternative to fuel energy. They have been primarily used in traditional handheld devices such as mobile phones, video cameras and electric power tools. Recently, the range of applications tends to gradually extend to electric vehicles (EVs, HEVs, PHEVs), large-capacity energy storage systems (ESSs) and uninterruptible power systems (UPSs).

A battery includes a positive electrode, a negative electrode, a separator interposed between the electrodes, and an electrolyte that electrochemically reacts with an active material coated on the positive electrode and the negative electrode, and as the number of charge/discharge cycles increases, capacity reduces. The capacity reduction may be caused by the degradation of the active material coated on the electrode, the side reaction of the electrolyte, the pore reduction of the separator, etc.

When battery capacity reduces, resistance increases and electrical energy that is lost as heat increases. Accordingly, when battery capacity reduces below the threshold, the battery performance notably reduces and an amount of heat generated increases, so it is necessary to investigate or replace the battery.

In the field of battery technology, an extent to which battery capacity reduces may be quantitatively indicated by a factor such as a State Of Health (SOH). SOH can be calculated by many methods, and one of those methods calculates SOH by quantifying an extent at which battery resistance at the current time increased compared to resistance at Beginning Of Life (BOL). For example, when battery resistance has increased by 20% compared to resistance at BOL, SOH may be estimated to be 80%.

The battery is likely to have higher resistance at lower state of charge (SOC) and lower resistance at higher temperature. It is because when the SOC of the battery reduces, an amount of active materials that can react with working ions reduces and the diffusion resistance of working ions in the active material increases, and when the temperature of the battery increases, the mobility of working ions increases. For reference, working ions change depending on the type of chemical species in the battery, and in the case of lithium based batteries, lithium ions correspond to working ions.

It is possible to extend the battery life by controlling the maximum allowable current based on SOH. To this end, it is necessary to accurately detect the battery resistance. The battery resistance is a very important parameter necessary for calculating the charge output or discharge output of the battery.

Conventionally, a resistance degradation rate, or an extent at which resistance data extracted in specific temperature and specific SOC condition increased compared to resistance at BOL is calculated based on pre-measured resistance data. Under the assumption that the battery degraded at the same level in other temperature and SOC conditions, the resistance degradation rate is applied to all conditions and this is used to estimate SOH and output. That is, after battery resistance is measured based on SOC and temperature, a lookup table is constructed and a resistance degradation rate is uniformly applied, and then resistance is looked up based on SOC and temperature in a real-time usage environment.

However, this method is impossible to estimate resistance in real time, and because the resistance degradation rate is uniformly applied, it is unsuitable for high temperature or low temperature, resulting in a prediction error of battery life. To overcome the limitation of the resistance degradation rate of the battery based on test data of the battery, suggestions have been made to calculate resistance by the Recursive Least Square (RLS) method in real time based on I-V data that dynamically changes, so as to estimate SOH and output. That is, resistance is estimated by calculating dV/dI in real time. However, when stable input with a small change in I-V data is entered, it is impossible to use RLS. For example, when there is a change in voltage but there is no change in current, it is impossible to calculate resistance. In this case, data is maintained at the latest estimated resistance, and when the current changes again, a resistance error occurs to find the actual resistance.

Disclosure

Technical Problem

The present disclosure is directed to providing an apparatus for reliably estimating the resistance of a battery using a simple algorithm.

The present disclosure is further directed to providing a method for reliably estimating the resistance of a battery using a simple algorithm.

Technical Solution

To solve the above-described problem, a battery resistance estimation apparatus according to the present disclosure includes a memory unit to store a resistance lookup table in which resistance data is recorded according to a state of charge-temperature (SOC-T) condition of a battery, and a control unit. The control unit includes a resistance accumulation calculation unit to measure I-V data while the battery is charged/discharged, calculates resistance by dV/dI repeatedly on a periodic basis and store the resistance in the memory unit, wherein the resistance is accumulated and stored by the SOC-T condition, and a resistance data update unit to calculate a weighted average of new resistance data and previously stored resistance data and update resistance data corresponding to a corresponding SOC-T condition to the weighted average, wherein the new resistance data is one of an average of the resistance data stored in the memory unit by the SOC-T condition, an average of maximum and minimum, and a maximum.

Preferably, the resistance data update unit may be configured to update the resistance data by an interpolation or extrapolation method using a weighted average of resistance data calculated in an SOC-T condition adjacent to an SOC-T condition in which resistance data to calculate a weighted average is not collected.

More preferably, the resistance data update unit may allocate and store a flag value by the SOC-T condition, wherein the flag value is used to identify whether the resistance data stored by the SOC-T condition is resistance data calculated in real time or resistance data estimated by the interpolation or extrapolation method.

Preferably, as a difference between the new resistance data and the previously stored resistance data increases, a weight assigned to the new resistance data to calculate the weighted average may increase. The weight increases with the increasing difference between Pre R/R@BOL and New R/R@BOL. Pre R is previously stored resistance in terms of SOC-T, R@BOL is resistance in initial state of the battery, and New R is new resistance data.

Preferably, the battery resistance estimation apparatus according to the present disclosure may further include a voltage measuring unit to measure a voltage of the battery, a current measuring unit to measure a current of the battery and a temperature measuring unit to measure a temperature of the battery, and the control unit may be configured to store the measured voltage, the measured current and the measured temperature in the memory unit.

In this instance, the control unit may be configured to determine the SOC of the battery by integrating the measured current stored in the memory unit.

In the battery resistance estimation apparatus according to the present disclosure, the control unit may be configured to determine the output of the battery using the updated resistance data, or transmit the updated resistance data to an external device.

To solve another problem, a battery resistance estimation method according to the present disclosure includes (a) storing a resistance lookup table in a memory unit, wherein the resistance lookup table records resistance data according to an SOC-T condition of a battery, (b) measuring I-V data while the battery is charged/discharged, calculating resistance by dV/dI repeatedly on a periodic basis and storing the resistance in the memory unit, wherein the resistance is accumulated and stored by the SOC-T condition, (c) calculating a weighted average between new resistance data and previously stored resistance data, wherein the new resistance data is one of an average of the resistance data stored in the memory unit by the SOC-T condition, an average of maximum and minimum, and a maximum, and (d) updating the resistance data stored in the memory unit by the SOC-T condition to the weighted average.

The objects of the present disclosure may be also achieved by a battery management system including the battery resistance estimation apparatus and a computer-readable recording medium having stored thereon a program for performing the battery resistance estimation method.

Advantageous Effects

According to the present disclosure, resistance suitable for environmental condition is calculated from initial data of the battery, and cumulative data is stored, and accordingly, it is possible to estimate the state of health (SOH) and output using resistance accumulated in each state of charge-temperature (SOC-T) condition or an increase in resistance relative to resistance at Beginning Of Life (BOL) without input condition limitation (in an environmental condition in which it is impossible to estimate resistance in real time).

According to the present disclosure, because different resistance degradation rates for each SOC-T condition are considered, it is possible to accurately estimate resistance and increase the accuracy in estimation of the state and life of the battery. Additionally, even when stable input with a small change in I-V data is entered, similar resistance to real-time resistance may be used.

Particularly, according to the present disclosure, when changing a resistance lookup table used to estimate the resistance of the battery, a weight assigned to new resistance data is reflected as a conservative approach to ensure stability in view of the degradation of the battery. Accordingly, it is possible to always reliably estimate the resistance of the battery corresponding to the level of degradation of the battery.

BRIEF DESCRIPTION OF THE DRAWINGS

The accompanying drawings illustrate preferred embodiments of the present disclosure, and together with the following detailed description, serve to provide a further understanding of the technical aspects of the present disclosure, and thus, the present disclosure is not construed as being limited to the drawings.

MODE FOR CARRYING OUT THE INVENTION

Figure 1:
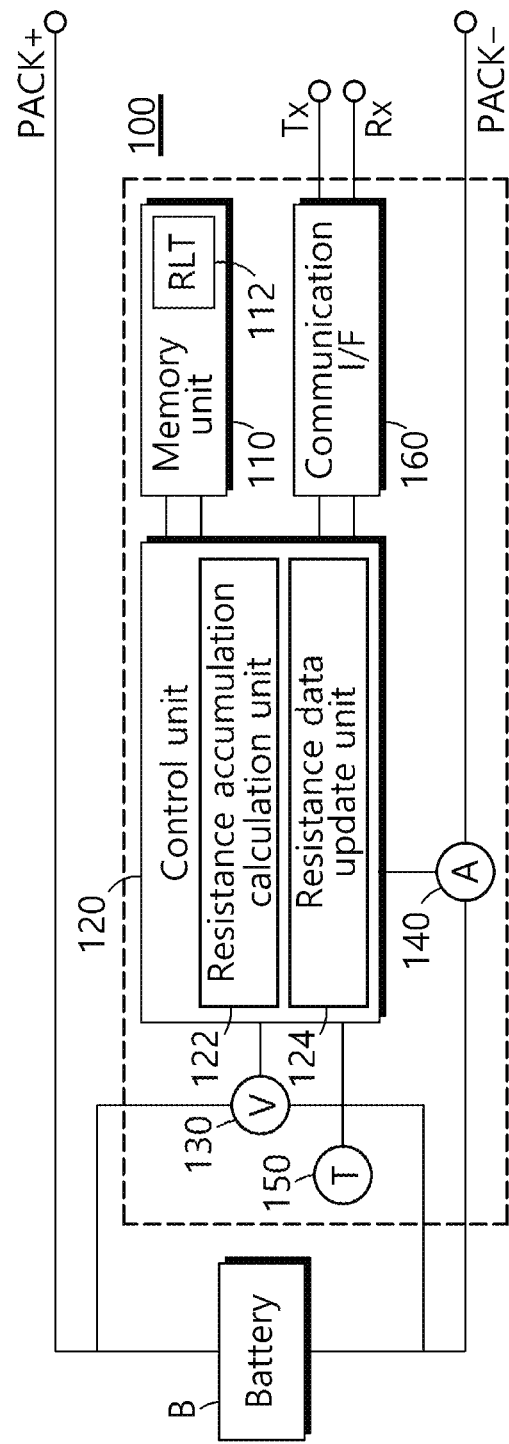
FIG. 1 is a schematic block diagram showing the configuration of a battery resistance estimation apparatus according to an embodiment of the present disclosure.

Hereinafter, the embodiments of the present disclosure will be described with reference to the accompanying drawings. Prior to the description, it should be understood that the terms or words used in the specification and the appended claims should not be construed as limited to general and dictionary meanings, but interpreted based on the meanings and concepts corresponding to the technical aspects of the present disclosure on the basis of the principle that the inventor is allowed to define the terms appropriately for the best explanation. Therefore, the embodiments described herein and illustrations shown in the drawings are just an embodiment of the present disclosure, but not intended to fully describe the technical aspects of the present disclosure, so it should be understood that various other equivalents and modifications could be made thereto at the time the invention was made.

In the embodiment described below, a battery refers to a lithium battery. Here, the lithium battery refers collectively to batteries in which lithium ions act as working ions during charging and discharging, causing electrochemical reactions at the positive electrode and the negative electrode.

Meanwhile, it should be interpreted as that even though the name of the battery changes depending on the type of electrolyte or separator used in the lithium battery, the type of packaging used to package the battery and the internal or external structure of the lithium battery, the lithium battery covers any battery using lithium ions as working ions.

The present disclosure may be also applied to batteries other than lithium batteries. Accordingly, it should be interpreted as that the present disclosure covers any type of battery to which the technical aspects of the present disclosure may be applied, though working ions are not lithium ions.

Additionally, the battery is not limited to the number of components. Accordingly, the battery should be interpreted as including a unit cell including an assembly of positive electrode/separator/negative electrode and an electrolyte in a packaging material as well as an assembly of unit cells, a module including assemblies connected in series and/or in parallel, a pack including modules connected in series and/or in parallel, and a battery system including packs connected in series and/or in parallel.

FIG. 1 is a schematic block diagram showing the configuration of a battery resistance estimation apparatus according to an embodiment of the present disclosure.

Referring to FIG. 1, the battery resistance estimation apparatus 100 according to the present disclosure is an apparatus for estimating the resistance of a battery B, and includes at least a memory unit 110 and a control unit 120.

The control unit 120 includes a processor to perform logical computation, and functions to estimate the resistance corresponding to the state of charge (SOC) and temperature of the battery B according to control logic described below.

The memory unit 110 is a storing medium capable of recording or erasing data electrically, magnetically, optically or quantum-mechanically, and as a non-limiting example, may be RAM, ROM or register.

Preferably, the memory unit 110 may be connected to the control unit 120, for example, through a data bus, to allow the control unit 120 to access it.

The memory unit 110 may store and/or update and/or erase programs including various types of control logics executed by the control unit 120, predefined parameters and/or data created when the control logics are executed.

The memory unit 110 may be logically split into two or more, and may be included in the control unit 120, but is not limited thereto.

Preferably, the memory unit 110 stores a resistance lookup table, e.g. resistance lookup table (RLT) 112, in which resistance data is recorded according to the state of charge-temperature (SOC-T) condition of the battery B. Preferably, the resistance lookup table includes a data structure in which resistance is mapped by SOC (or voltage) and T. That is, resistance data forms m[SOC(or voltage)]×n[temperature] matrix.

Table 1 shows an example of the resistance lookup table.

TABLE 1

<Example of the resistance lookup table>

| T(° C.) | | SOC(%) | | | | |
| --- | --- | --- | --- | --- | --- | --- |
| | | 10 | 20 | 30 | 40 | |
| ... | ... | ... | ... | ... | ... | ... |
| 15 | ... | 1.58 | 1.5 | 1.46 | 1.41 | ... |
| 20 | ... | 1.57 | 1.49 | 1.45 | 1.4 | ... |
| 25 | ... | 1.56 | 1.48 | 1.45 | 1.4 | ... |
| 30 | ... | 1.55 | 1.47 | 1.45 | 1.39 | ... |
| 35 | ... | 1.54 | 1.46 | 1.44 | 1.39 | ... |
| ... | ... | ... | ... | ... | ... | ... |

In Table 1, the row contains a list of SOCs (%), and the column contains a list of temperatures (T, ° C.). The unit of resistance in each cell is mΩ. Table 1 exemplifies resistance stored for each condition, but resistance data stored in the resistance lookup table may indicate an increase in resistance relative to resistance at Beginning Of Life (BOL) (no unit). Additionally, although a structure in which resistance is mapped according to the SOC-T condition is taken as an example, the data structure may be in which resistance is mapped by voltage-T.

The data in the resistance lookup table may be measured through the charge/discharge experiment of the battery B.

Figure 2:
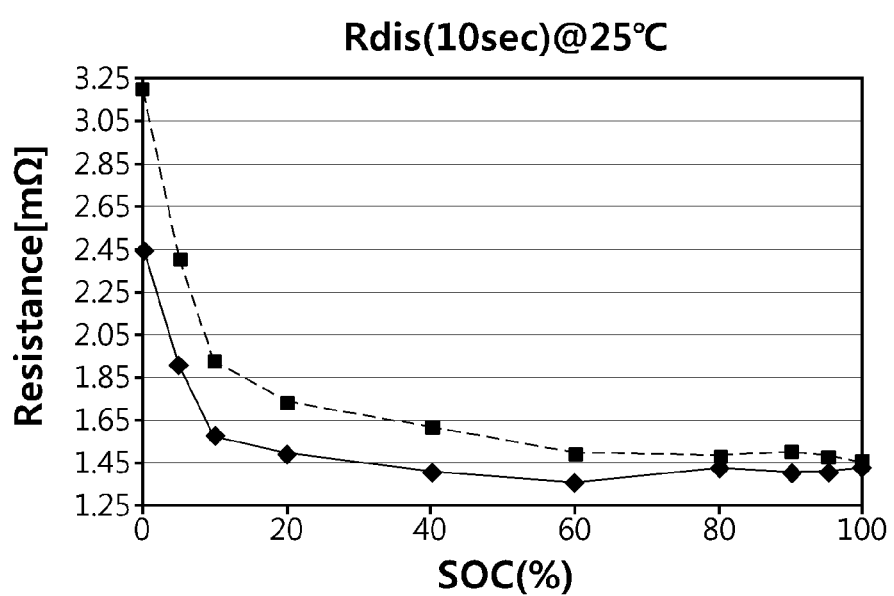
FIG. 2 is a graph showing measured resistance vs State Of Charge in batteries having different degradation conditions according to an embodiment of the present disclosure.

For example, FIG. 2 is a graph showing how resistance changes according to SOC in a lithium battery including $LiMnO_2$ and graphite in the positive electrode and the negative electrode respectively.

In FIG. 2, the solid line is a resistance profile measured when the lithium battery is at BOL, and the dotted line is a resistance profile measured for Middle Of Life (MOL) at about 20% degraded capacity of the lithium battery.

Each resistance profile is obtained through the Hybrid Pulse Power Characterization (HPPC) discharge test, and in the HPPC test, the discharge time is set to 10 sec, the discharge pulse magnitude is set to 5 C-rate, and the temperature of the lithium battery is maintained at 25° C. during the HPPC test.

As shown in FIG. 2, it can be seen that the resistance of the lithium battery increases as SOC reduces, and a change in resistance is not relatively large when SOC is in the range between 40% and 80%. Additionally, it can be seen that when the capacity of the lithium battery degrades, resistance increases compared to resistance at BOL.

In the resistance lookup table of Table 1, 25° C. resistance data reflects BOL in the experimental results of FIG. 2. The resistance profiles as shown in FIG. 2 are experimentally measured and collected at many temperatures to construct the resistance lookup table as shown in Table 1.

Preferably, the control unit 120 may be electrically coupled to a voltage measuring unit 130, a current measuring unit 140 and a temperature measuring unit 150 to determine SOC and resistance of the battery B.

The voltage measuring unit 130 includes a known voltage measurement circuit, and periodically measures the voltage of the battery B at a time interval under the control of the control unit 120, and outputs the measured voltage to the control unit 120. Then, the control unit 120 stores the periodically inputted measured voltage in the memory unit 110.

The current measuring unit 140 includes a sense resistor or a hall sensor, and measures the magnitude of the charge or discharge current of the battery B at a time interval under the control of the control unit 120 and outputs the measured current to the control unit 120. Then, the control unit 120 stores the periodically inputted measured current in the memory unit 110.

The temperature measuring unit 150 includes a thermocouple that is a type of temperature sensor, and periodically measures the temperature of the battery B at a time interval under the control of the control unit 120 and outputs the measured temperature to the control unit 120. Then, the control unit 120 stores the periodically inputted measured temperature in the memory unit 110.

Preferably, the control unit 120 may periodically determine the SOC of the battery B by the current integration method by referring to the measured current stored in the memory unit 110.

In detail, when charge or discharge of the battery B starts, the control unit 120 may measure an Open Circuit Voltage (OCV) of the battery B by controlling the voltage measuring unit 130, determine an initial SOC SOC0 corresponding to the measured OCV by referring to the 'OCV-SOC lookup table' stored in the memory unit 110, determine the current SOC by adding the integrated charge current and discharge current to the initial SOC SOC0 during charging or discharging, and store the determined SOC in the memory unit 110.

Of course, the SOC of the battery B may be determined by methods other than the current integration method. In an example, the control unit 120 may adaptively determine the SOC of the battery B by periodically inputting the measured voltage, the measured current and the measured temperature into an adaptive filter, for example, an extended Kalman filter.

A resistance accumulation calculation unit 122 of the control unit 120 periodically calculates and accumulate resistance data by dV/dI from I-V data that was measured for each SOC and temperature and stored in the memory unit 110, while the battery B is charged/discharged, i.e., during Operating Cycle, for example, while the vehicle is driving.

Table 2 exemplifies a table in which resistance calculated repeatedly on a periodic basis by the resistance accumulation calculation unit 122 of the battery estimation apparatus 100 according to the present disclosure is accumulated and stored by the SOC-T condition.

TABLE 2

<Example of the table in which resistance calculated repeatedly on a periodic basis is accumulated and stored by the SOC-T condition>

| T(° C.) | | SOC(%) | | | | |
|---|---|---|---|---|---|---|
| | | 10 | 20 | 30 | 40 | |
| ... | ... | ... | ... | ... | ... | ... |
| 15 | ... | 1.58, 1.6, 1.61, 1.64 | 1.5, 1.53, 1.57, 1.62 | 1.46, 1.47, 1.48 | 1.41, 1.43 | ... |
| 20 | ... | 1.57, 1.59, 1.6 | 1.49, 1.5, 1.52, 1.53 | 1.45, 1.47 | 1.4, 1.41, 1.42 | ... |
| 25 | ... | 1.56, 1.57, 1.58, 1.59 | 1.48, 1.49 | 1.45, 1.46 | 1.4, 1.46 | ... |
| 30 | ... | 1.55, 1.57 | 1.47, 1.48, 1.49 | 1.45, 1.46 | 1.39, 1.42 | ... |
| 35 | ... | 1.54, 1.56 | 1.46, 1.48 | 1.44, 1.45 | 1.38, 1.4, 1.41, 1.42 | ... |
| ... | ... | ... | ... | ... | ... | ... |

Referring to Table 2, resistance calculated repeatedly on a periodic basis is stored by the SOC-T condition.

A resistance data update unit 124 of the control unit 120 reflects data accumulated during charging/discharging of the battery B on the existing resistance data stored by the SOC-T condition by weighting. Resistance data updates may be performed when the charge/discharge of the battery B ends, such as, for example, when the ignition key of the vehicle is off.

In this instance, the resistance data update unit 124 calculates a weighted average of new resistance data, namely, one of an average of resistance data stored in the memory unit 110 for each SOC-T condition, an average of maximum and minimum and the maximum, and previously stored resistance data, and updates resistance data corresponding to a corresponding SOC-T condition to the weighted average.

The weighted average refers to a method that grades the importance of objects so that an important object has a greater influence on the average, and assigns a weight to an important object and averages the objects. That is, it is an average obtained by multiplying each weight corresponding to the importance or influence when obtaining an average of N.

For example, an arithmetic mean M of $x_1, x_2, \ldots, x_n$ may be obtained by $M=(x_1+x_2+\ldots+x_n)/N$. When among N, the number of $x_1$ is $f_1$, the number of $x_2$ is $f_2, \ldots,$ and the number of $x_n$ is $f_n$, $f_1+f_2+\ldots+f_n=N$, the sum is $f_1x_1+f_2x_2+\ldots+f_nx_n$, and $M=(f_1x_1+f_2x_2+\ldots+f_nx_n)/N$. When weights $f_1 f_2 \ldots, f_n$ are respectively assigned to n different numbers $x_1, x_2 \ldots, x_n$, the formula M is a weighted average. It may be understood that $x_1, x_2, \ldots, x_n$ have importance or influence of $f_1, f_2, \ldots, f_n$.

The present disclosure calculates a weighted average between new resistance data and previously stored resistance data. When A is previously stored resistance, B is new resistance data and a weight is α, a weighted average of A and B using the weight α is (1−α)×A+α×B. The weight is assigned to the new resistance data for use of resistance estimation.

Here, there may many methods of reflecting the new resistance data on the existing resistance data at the weight (α).

In a first embodiment, an average of resistance data calculated during the operation cycle may be calculated, and using this average as new resistance data, a weighted average between the corresponding average and the previously stored resistance may be stored as resistance data of the corresponding SOC-T. α is set to increase with the increasing difference between Pre R/R@BOL and New R/R@BOL. This criterion signifies that a conservative approach is taken because resistance estimation is directly related to degradation and stability of the battery. That is, it means that the latest calculated resistance data is more reliable. For example, α is preset according to a difference between Pre R/R@BOL and New R/R@BOL.

Table 3 shows an example of the weight applied to new resistance data when calculating the weighted average between the new resistance data and the previously stored resistance data, and shows an example of a that is preset according to a difference between Pre R/R@BOL and New R/R@BOL. Here, Pre R is the previously stored resistance at SOC-T, R@BOL is resistance at the initial state of the battery, and New R is new resistance data. These values are all stored in the memory unit 110.

TABLE 3

<Example of the weight applied to new resistance data>

| Difference between Pre R/R@BOL and New R/R@BOL | Weight(α) |
|---|---|
| 0~0.01 | 0.5 |
| 0.01~0.02 | 0.6 |
| 0.02~0.03 | 0.7 |
| 0.03~0.04 | 0.8 |
| 0.04~0.05 | 0.9 |
| 0.05~ | 1 |

In an example presented in Table 3, α has a value between 0.5 and 1. According to this example, SOC-T resistance data after updating the lookup table of Table 1 to the weighted average using the accumulation table such as Table 2 and the weight of Table 3 is as shown in Table 4.

TABLE 4

<SOC-T resistance data after updating Table 1 to the weighted average according to the first embodiment>

| T(° C.) | | SOC(%) | | | | |
|---|---|---|---|---|---|---|
| | | 10 | 20 | 30 | 40 | |
| ... | ... | ... | ... | ... | ... | ... |
| 15 | ... | 1.6 | 1.54 | 1.47 | 1.42 | ... |
| 20 | ... | 1.58 | 1.5 | 1.46 | 1.41 | ... |
| 25 | ... | 1.57 | 1.48 | 1.45 | 1.42 | ... |
| 30 | ... | 1.56 | 1.48 | 1.45 | 1.4 | ... |
| 35 | ... | 1.55 | 1.47 | 1.44 | 1.39 | ... |
| ... | ... | ... | ... | ... | ... | ... |

Describing the updates as shown in Table 4, for example, in Table 2, an average of resistance data calculated during the operation cycle at 10%-15° C. SOC-T is (1.58+1.6+1.61+1.64)/4 which is calculated to be 1.608. 1.608 is New R at 10%-15° C. SOC-T. Referring to Table 1, Pre R at 10%-15° C. SOC-T is 1.58. A difference between Pre R/R@BOL and New R/R@BOL is about 0.017, and referring to Table 3, α corresponding to the difference value is 0.6. Accordingly, a weighted average between new resistance data and previously stored resistance is 0.4×1.58+0.6× 1.608, and the value is 1.6. The weighted average of 1.6 is updated and stored as estimated resistance data at 10%-15° C. SOC-T.

Likewise, referring to Table 2 again, at 20%-15° C. SOC-T, an average of resistance data calculated during the operation cycle is (1.5+1.53+1.57+1.62)/4 that equals 1.555. 1.555 is New R at 20%-15° C. SOC-T. Referring to Table 1, Pre R at 20%-15° C. SOC-T is 1.5. A difference between Pre R/R@BOL and New R/R@BOL is calculated to be about 0.037, and according to Table 3, in this case, α is 0.8. Accordingly, a weighted average between new resistance data and previously stored resistance is 1.54 as a result of calculating 0.2×1.5+0.8×1.555. The weighted average of 1.54 is updated and stored as estimated resistance data at 20%-15° C. SOC-T as shown in Table 4.

In another example, referring back to Table 2, at 20%-25° C. SOC-T, an average of resistance data calculated during the operation cycle is (1.48+1.49)/2 that equals 1.485. 1.485 is New R at 20%-25° C. SOC-T. Referring to Table 1, Pre R at 20%-25° C. SOC-T is 1.48. A difference between Pre R/R@BOL and New R/R@BOL is about 0.003, and referring to Table 3, the corresponding α is 0.5. Accordingly, a weighted average between new resistance data and previously stored resistance is 0.5×1.48+0.5×1.485, which is calculated and rounded off to 1.48. The weighted average of 1.48 is updated and stored as estimated resistance data at 20%-25° C. SOC-T as shown in Table 4.

For other SOC-T conditions not exemplified herein, calculation, update and storage may be performed as described above, and a new resistance data table may be finally obtained as shown in Table 4. The estimated resistance data may be used to estimate SOH and output.

In a second embodiment, an average of maximum and minimum of resistance data calculated during the operation cycle is calculated, and using this average as new resistance data, a weighted average between the corresponding average and the previously stored resistance may be stored as resistance data of the corresponding SOC-T. Except that an average of maximum and minimum of resistance data calculated during the operation cycle is new resistance data, updating resistance data to the weighted average is the same as the previous first embodiment.

According to this second embodiment, SOC-T resistance data after updating the lookup table of Table 1 using the accumulation table of Table 2 and the weight of Table 3 is as shown in Table 5.

TABLE 5

<SOC-T resistance data after updating Table 1 to the weighted average according to the second embodiment>

| T(° C.) | ... | SOC(%) 10 | 20 | 30 | 40 | ... |
|---|---|---|---|---|---|---|
| ... | ... | ... | ... | ... | ... | ... |
| 15 | ... | 1.6 | 1.55 | 1.47 | 1.42 | ... |
| 20 | ... | 1.58 | 1.5 | 1.46 | 1.41 | ... |
| 25 | ... | 1.57 | 1.48 | 1.45 | 1.42 | ... |

TABLE 5-continued

<SOC-T resistance data after updating Table 1 to the weighted average according to the second embodiment>

| T(° C.) | ... | SOC(%) 10 | 20 | 30 | 40 | ... |
|---|---|---|---|---|---|---|
| 30 | ... | 1.56 | 1.48 | 1.45 | 1.4 | ... |
| 35 | ... | 1.55 | 1.47 | 1.44 | 1.39 | ... |
| ... | ... | ... | ... | ... | ... | ... |

Table 5 is described as follows:

Referring to Table 2, at 10%-15° C. SOC-T, an average of maximum and minimum of resistance data calculated during the operation cycle is (1.58+1.64)/2 that equals 1.61. 1.61 is New R at 10%-15° C. SOC-T. Referring to Table 1, Pre R at 10%-15° C. SOC-T is 1.58. A difference between Pre R/R@BOL and New R/R@BOL is about 0.019, and referring to Table 3, α is 0.6. Accordingly, a weighted average between new resistance data and previously stored resistance is 0.4×1.58+0.6×1.61 which is calculated to be 1.6. The weighted average of 1.6 is updated and stored as estimated resistance data at 10%-15° C. SOC-T.

Likewise, at 20%-15° C. SOC-T, referring to Table 2, an average of maximum and minimum of resistance data calculated during the operation cycle is (1.5+1.62)/2 that equals 1.56. 1.56 is New R at 20%-15° C. SOC-T. Referring to Table 1, Pre R at 20%-15° C. SOC-T is 1.5. A difference between Pre R/R@BOL and New R/R@BOL is about 0.04, and according to Table 3, the corresponding α is 0.9. Accordingly, a weighted average between new resistance data and previously stored resistance is 0.1×1.5+0.9×1.56, which is calculated to be 1.55. The weighted average of 1.55 is updated and stored as estimated resistance data at 20%-15° C. SOC-T as shown in Table 5.

In another example, at 20%-25° C. SOC-T, referring to Table 2, an average of maximum and minimum of resistance data calculated during the operation cycle is (1.48+1.49)/2, which is calculated to be 1.485. 1.485 is New R at 20%-25° C. SOC-T. Referring to Table 1, Pre R at 20%-25° C. SOC-T is 1.48. A difference between Pre R/R@BOL and New R/R@BOL is about 0.003, and referring to Table 3, α is 0.5. Accordingly, a weighted average between new resistance data and previously stored resistance is 0.5×1.48+0.5×1.485, which is calculated and rounded off to 1.48. The weighted average of 1.48 is updated and stored as estimated resistance data at 20%-25° C. SOC-T as shown in Table 5.

For other SOC-T conditions, calculation, update and storage may be performed as described above to obtain a new resistance data table as shown in Table 5. It can be seen that a change in criterion for selecting new resistance data between the first and second embodiments changes leads to a small difference between Tables 4 and 5.

In a third embodiment, using the maximum of resistance data calculated during the operation cycle as new resistance data, a weighted average between the corresponding maximum and the previously stored resistance may be stored as resistance data of the corresponding SOC-T. Except that the maximum of resistance data calculated during the operation cycle is new resistance data, updating resistance data to the weighted average is the same as the previous first and second embodiments.

According to this third embodiment, SOC-T resistance data after updating the lookup table of Table 1 using the accumulation table of Table 2 and the weight of Table 3 is as shown in Table 6.

TABLE 6

<SOC-T resistance data after updating Table 1 to
the weighted average according to the third embodiment>

| T(° C.) | | SOC(%) | | | | |
| --- | --- | --- | --- | --- | --- | --- |
| | | 10 | 20 | 30 | 40 | |
| ... | ... | ... | ... | ... | ... | ... |
| 15 | ... | 1.63 | 1.62 | 1.47 | 1.42 | ... |
| 20 | ... | 1.59 | 1.5 | 1.46 | 1.41 | ... |
| 25 | ... | 1.58 | 1.49 | 1.46 | 1.45 | ... |
| 30 | ... | 1.56 | 1.48 | 1.46 | 1.41 | ... |
| 35 | ... | 1.55 | 1.47 | 1.45 | 1.41 | ... |
| ... | ... | ... | ... | ... | ... | ... |

Referring to Table 2, at 10%-15° C. SOC-T, the maximum of resistance data calculated during the operation cycle is 1.64. According to this example, 1.64 is New R at 10%-15° C. SOC-T. Referring to Table 1, Pre R at 10%-15° C. SOC-T is 1.58. A difference between Pre R/R@BOL and New R/R@BOL is about 0.038, and referring to Table 3, α is 0.8. Accordingly, a weighted average between new resistance data and previously stored resistance is 0.2×1.58+0.8×1.64, which is calculated to be 1.63. The weighted average of 1.63 is updated and stored as estimate resistance data at 10%-15° C. SOC-T.

Likewise, referring to Table 2, at 20%-15° C. SOC-T, the maximum of resistance data calculated during the operation cycle is 1.62. 1.62 is New R at 20%-15° C. SOC-T. Referring to Table 1, Pre R at 20%-15° C. SOC-T is 1.5. A difference between Pre R/R@BOL and New R/R@BOL is about 0.08, and referring to Table 3, α is 1. Accordingly, a weighted average between new resistance data and previously stored resistance is 0×1.5+1×1.62, which is calculated to be 1.62. The weighted average of 1.62 is updated and stored as estimated resistance data at 20%-15° C. SOC-T.

In another example, seeing 20%-25° C. SOC-T in Table 2, the maximum of resistance data calculated during is 1.49. 1.49 is New R at 20%-25° C. SOC-T. Referring to Table 1, Pre R at 20%-25° C. SOC-T is 1.48. A difference between Pre R/R@BOL and New R/R@BOL is about 0.007, and referring to Table 3, α is 0.5. Accordingly, a weighted average between new resistance data and previously stored resistance is 0.5×1.48+0.5×1.49, which is calculated to be 1.49. The weighted average of 1.49 is updated and stored as estimated resistance data at 20%-25° C. SOC-T.

For other SOC-T conditions, calculation, update and storage may be performed as described above, and a resistance data table may be finally obtained as shown in Table 6. When comparing the first to third embodiments, it can be seen that a change in criterion for selecting new resistance data leads to a small difference between Tables 4 to 6. The most conservative approach is the third embodiment using the maximum.

As described above, the updated resistance data is used to estimate SOH and output. Meanwhile, after updating as shown in Tables 4 to 6, when the battery B is reused, resistance data is updated by performing again the step of accumulating resistance data, for example, periodically calculating and accumulating resistance data by dV/dI from I-V data that was measured again for each SOC and temperature during charging/discharging of the battery B and stored in the memory unit 110, and the step of updating resistance data during key off of the battery B.

For example, assume that resistance calculated repeatedly on a periodic basis while in use after recharging the battery having resistance data updated as shown in Table 4 is accumulated and stored again by the SOC-T condition, a table may be obtained as shown in Table 7.

TABLE 7

<Example of the table in which resistance calculated
repeatedly on a periodic basis based on Table 4
is accumulated and stored by SOC-T condition>

| T(° C.) | | SOC(%) | | | | |
| --- | --- | --- | --- | --- | --- | --- |
| | | 10 | 20 | 30 | 40 | |
| ... | ... | ... | ... | ... | ... | ... |
| 15 | ... | 1.6, 1.62 | 1.54, 1.55, 1.56 | 1.47, 1.49 | 1.42, 1.44, 1.46 | ... |
| 20 | ... | 1.58, 1.59, 1.6, 1.61 | 1.5, 1.52 | 1.46, 1.47, 1.48 | 1.41, 1.44 | ... |
| 25 | ... | 1.57, 1.58, 1.6 | 1.48, 1.5, 1.51 | 1.45, 1.48 | 1.42, 1.43 | ... |
| 30 | ... | 1.56, 1.59 | 1.48, 1.51 | 1.45, 1.47 | 1.4, 1.42, 1.43 | ... |
| 35 | ... | 1.55, 1.56 | 1.47, 1.48, 1.5, 1.51 | 1.44, 1.45 | 1.39, 1.42 | ... |
| ... | ... | ... | ... | ... | ... | ... |

The resistance data stored in the lookup table of Table 4 is Pre R. When the lookup table of Table 4 is updated according to the previous first embodiment in which an average of resistance data is selected as new resistance data using the accumulation table of Table 7 and the weight of Table 3, SOC-T resistance data after updating is as shown in Table 8.

TABLE 8

<SOC-T resistance data after updating Table 4 to
the weighted average according to the first embodiment>

| T(° C.) | | SOC(%) | | | | |
| --- | --- | --- | --- | --- | --- | --- |
| | | 10 | 20 | 30 | 40 | |
| ... | ... | ... | ... | ... | ... | ... |
| 15 | ... | 1.61 | 1.55 | 1.48 | 1.43 | ... |
| 20 | ... | 1.59 | 1.51 | 1.47 | 1.42 | ... |
| 25 | ... | 1.58 | 1.49 | 1.46 | 1.42 | ... |
| 30 | ... | 1.57 | 1.49 | 1.46 | 1.41 | ... |
| 35 | ... | 1.55 | 1.48 | 1.44 | 1.4 | ... |
| ... | ... | ... | ... | ... | ... | ... |

For example, referring to Table 7, at 10%-15° C. SOC-T, an average of resistance data calculated during the operation cycle is (1.6+1.62)/2 that equals 1.61. 1.61 is New R at 10%-15° C. SOC-T. Referring to Table 4, Pre R at 10%-15° C. SOC-T is 1.6, and referring to Table 1, R@BOL is 1.58. A difference between Pre R/R@BOL and New R/R@BOL is about 0.006, and referring to Table 3, α is 0.5. Accordingly, a weighted average between new resistance data and previously stored resistance is 0.5×1.6+0.5×1.61, which is calculated to be 1.61. The weighted average of 1.61 is updated and stored as estimated resistance data at 10%-15° C. SOC-T.

Likewise, in Table 7, at 20%-15° C. SOC-T, an average of resistance data calculated during the operation cycle is (1.54+1.55+1.56)/3 that equals 1.55. 1.55 is New R at 20%-15° C. SOC-T. Referring to Table 4, Pre R at 20%-15° C. SOC-T is 1.54, and referring to Table 1, R@BOL is 1.5. A difference between Pre R/R@BOL and New R/R@BOL is about 0.007, and referring to Table 3, α is 0.5. Accordingly, a weighted average between new resistance data and previously stored resistance is 0.5×1.54+0.5×1.55, which equals 1.55. The weighted average of 1.55 is updated and stored as estimated resistance data at 20%-15° C. SOC-T.

In another example, at 20%-25° C. SOC-T, according to Table 7, an average of resistance data calculated during the operation cycle is (1.48+1.5+1.51)/3 that equals 1.5. 1.5 is New R at 20%-25° C. SOC-T. Referring to Table 4, Pre R at 20%-25° C. SOC-T is 1.48, and according to Table 1, R@BOL is also 1.48. A difference between Pre R/R@BOL and New R/R@BOL is 0.01, and referring to Table 3, α is 0.6. A weighted average between new resistance data and previously stored resistance is 0.4×1.48+0.6×1.5 that equals 1.49. The weighted average of 1.49 is updated and stored as estimated resistance data at 20%-25° C. SOC-T.

For other SOC-T conditions, calculation, update and storage is performed as described above to obtain a new resistance data table as shown in Table 8.

The process of weighting and updating while the battery is not used by using resistance data accumulated while the battery is in use after recharging is performed repeatedly until battery replacement to always preserve the most reliable resistance data.

In some cases, when stable input with a small change in I-V data is entered, resistance cumulative data may not be collected. Additionally, for SOC condition in which the battery B is not used, cumulative data is not collected. Accordingly, for a certain SOC-T condition in which resistance cumulative data is not collected, diffusion estimation is performed based on the estimated resistance data in other SOC-T condition in which resistance data is collected. That is, a function of calculating resistance R by SOC and T using new estimated resistance data corresponding to adjacent SOC-T condition is calculated, and resistance data in the SOC-T condition in which resistance data is not collected is updated and stored by the interpolation method or the extrapolation method based on the corresponding function.

For example, Table 9 shows that for some certain SOC-T conditions, resistance cumulative data is not collected, as compared to Table 2.

TABLE 9

<Resistance data in case that for some SOC-T conditions, resistance cumulative data is not collected>

| T(° C.) | ... | SOC(%) | | | | |
| --- | --- | --- | --- | --- | --- | --- |
| | | 10 | 20 | 30 | 40 | ... |
| ... | ... | ... | ... | ... | ... | ... |
| 15 | ... | 1.58, 1.60, 1.61, 1.64 | 1.5, 1.53, 1.57, 1.62 | 1.46, 1.47, 1.48 | 1.41, 1.43 | ... |
| 20 | ... | 1.57, 1.59, 1.6 | 1.49, 1.5, 1.52, 1.53 | 1.45, 1.47 | 1.4, 1.41, 1.42 | ... |
| 25 | ... | 1.56, 1.57, 1.58, 1.59 | 1.48 | 1.45, 1.46 | 1.4, 1.46 | ... |
| 30 | ... | 1.55, 1.57 | 1.47, 1.48, 1.49 | 1.45, 1.46 | 1.39, 1.42 | ... |
| 35 | ... | 1.54, 1.56 | 1.46, 1.48 | 1.44 | 1.38, 1.4, 1.41, 1.42 | ... |
| ... | ... | ... | ... | ... | ... | ... |

As illustrated, in Table 9, at 10%-25° C. SOC-T and 30%-25° C. SOC-T, resistance cumulative data is collected in the same way as Table 2, while at 20%-25° C. SOC-T, resistance cumulative data is not collected (it is indicated in bold that only previous resistance data is stored). In this case, a function of calculating R by SOC and T using the updated resistance data at 10%-25° C. and 30%-25° C. adjacent to 20%-25° C. SOC-T is calculated, and 20%-25° C. resistance data is updated by the interpolation method based on the corresponding function.

First, for SOC-T conditions in which resistance cumulative data is collected, resistance data is updated and stored through the process as described above with reference to Tables 1 to 4. Then, for SOC-T conditions in which resistance cumulative data is collected, new estimated resistance values of the intermediate step will be obtained as shown in Table 10.

TABLE 10

<For SOC-T conditions in which resistance cumulative data is collected in Table 9, updated resistance data>

| T(° C.) | ... | SOC(%) | | | | |
| --- | --- | --- | --- | --- | --- | --- |
| | | 10 | 20 | 30 | 40 | ... |
| ... | ... | ... | ... | ... | ... | ... |
| 15 | ... | 1.6 | 1.54 | 1.47 | 1.42 | ... |
| 20 | ... | 1.58 | 1.5 | 1.46 | 1.41 | ... |
| 25 | ... | 1.57 | | 1.45 | 1.42 | ... |
| 30 | ... | 1.56 | 1.48 | 1.45 | 1.4 | ... |
| 35 | ... | 1.55 | 1.47 | | 1.39 | ... |
| ... | ... | ... | ... | ... | ... | ... |

Referring to Table 10, at 25° C., the updated resistance data at 10% SOC is 1.57, and the updated resistance data at 30% SOC is 1.45. In these two conditions, to be simplest, resistance(R)=1.63−0.006×SOC may be obtained. In the case of 20% SOC at which cumulative data is not collected, resistance is calculated to be 1.51 by substituting 20 into SOC according to this formula. Accordingly, the immediately previous resistance 1.48 stored as shown in Table 1 at 20%-25° C. SOC-T is updated to the diffusion estimated new resistance of 1.51, obtaining Table 11.

TABLE 11

<For SOC-T conditions in which resistance cumulative data is not collected in Table 9, resistance data updated by diffusion estimation>

| T(° C.) | ... | SOC(%) | | | | |
| --- | --- | --- | --- | --- | --- | --- |
| | | 10 | 20 | 30 | 40 | ... |
| ... | ... | ... | ... | ... | ... | ... |
| 15 | ... | 1.6 | 1.54 | 1.47 | 1.42 | ... |
| 20 | ... | 1.58 | 1.5 | 1.46 | 1.41 | ... |
| 25 | ... | 1.57 | 1.51 | 1.45 | 1.42 | ... |
| 30 | ... | 1.56 | 1.48 | 1.45 | 1.4 | ... |
| 35 | ... | 1.55 | 1.47 | 1.39 | 1.39 | ... |
| ... | ... | ... | ... | ... | ... | ... |

Additionally, referring to Table 9 again, at 35° C., in the case of 10% SOC and 20% SOC, resistance cumulative data is collected, while in the case of SOC 30%, resistance cumulative data is not collected. In this case, a function for calculating R by SOC and T using the updated resistance data at 10% SOC and 20% SOC adjacent to 30% SOC is calculated, and resistance data at 30% SOC is updated by the extrapolation method based on the corresponding function.

Referring to Table 10, at 35° C., the updated resistance data at 10% SOC is 1.55 and the updated resistance data at 20% SOC is 1.47. In these two conditions, resistance (R)=1.63−0.008×SOC may be obtained. At 30% SOC, resistance is calculated to be 1.39 according to this formula. Accordingly, the immediately previous resistance 1.44 stored as shown in Table 1 at 30%-35° C. SOC-T is updated to new resistance 1.39, obtaining Table 11.

As described above, Table 11 shows SOC-T resistance data after updating the lookup table of Table 1 using the accumulation table of Table 9 and the weight of Table 3, and diffusion estimation by the above-described method. In this instance, to place a priority on real-time estimated resistance over diffusion estimated data, it is desirable to store resistance data by setting a flag value to identify diffusion estimated data or real-time estimated data. A flag register related to flag value storage may be implemented by those skilled in the art, and its detailed description is omitted herein.

According to the present disclosure, resistance suitable for environmental condition is calculated from initial data of the battery, and cumulative data is stored, and accordingly, it is possible to estimate SOH and output using resistance accumulated in each SOC-T condition or an increase in resistance relative to resistance at BOL without input condition limitation (in an environmental condition in which it is impossible to estimate resistance in real time).

According to the present disclosure, it is possible to increase the accuracy in estimation of the state and life of the battery by resistance estimation, taking into account that the resistance degradation rate varies in each SOC-T condition. Additionally, even when stable input with a small change in I-V data is entered, similar resistance to real-time resistance may be used even in a condition in which it is impossible to obtain resistance data.

Particularly, according to the present disclosure, when changing a resistance lookup table used to estimate the resistance of the battery, a weight assigned to new resistance data is reflected as a conservative approach to ensure stability in view of the degradation of the battery. Accordingly, it is possible to reliably estimate the resistance of the battery corresponding to the level of degradation of the battery.

The control unit 120 may determine the output of the battery B using the resistance of the battery B estimated and updated as described above, and store the determined output information in the memory unit 110.

In an example, the output of the battery B may be calculated using the following Equation.

$$\text{Output of battery} = I \times \frac{|OCV_{@SOC} - V_{cut\_off}|}{R_{@SOC,T}}$$

In the above Equation, I denotes the magnitude of the charge current or the discharge current of the battery B. OCV@SOC is the OCV corresponding to the current SOC of the battery B, and may be referred to from 'OCV-SOC lookup table' stored in the memory unit 110. Vcut_off is the voltage at which the charge or discharge of the battery is cut off, and denotes the maximum charge voltage Vmax when the battery B is charged, and the minimum discharge voltage Vmin when the battery B is discharged. R@SOC,T denotes the resistance corresponding to the current SOC and temperature of the battery B, and is estimated by the present disclosure, i.e., updated to the weighted average of new resistance data and previously stored resistance data.

The control unit 120 may quantitatively estimate the SOH of the battery B using the estimated resistance of the battery B.

In an example, the SOH (%) of the battery B may be calculated using the following Equation.

$$SOH = 100 \times (R@BOL/R@SOC,T)$$

In the above Equation, R@SOC,T is the resistance of the battery B corresponding to the current SOC and temperature of the battery B, and is estimated by the present disclosure, i.e., updated to the weighted average of new resistance data and previously stored resistance data.

According to another aspect, the control unit 120 may be combined with a communication interface (I/F) 160 to output at least one of the estimated resistance, output and SOH values to an external device (not shown) through the communication interface 160.

Preferably, the external device may be a controller of a device load that is supplied with electrical energy from the battery B, but the present disclosure is not limited thereto.

Meanwhile, the control unit 120 may selectively include a processor, an Application-Specific Integrated Circuit (ASIC), a chipset, a logic circuit, a register, a communication modem and a data processing device known in the art to execute various control logics disclosed herein.

Additionally, when the control logic is implemented in software, the control unit 120 may be implemented as a set of program modules. In this instance, the program module may be stored in the memory unit 110, and executed by the processor. The memory unit 110 may be inside or outside of the processor, and may be connected to the processor with a variety of well-known means.

Hereinafter, a battery resistance estimation method according to the present disclosure will be described in detail with reference to FIG. 3 based on the above-described configuration.

Figure 3:
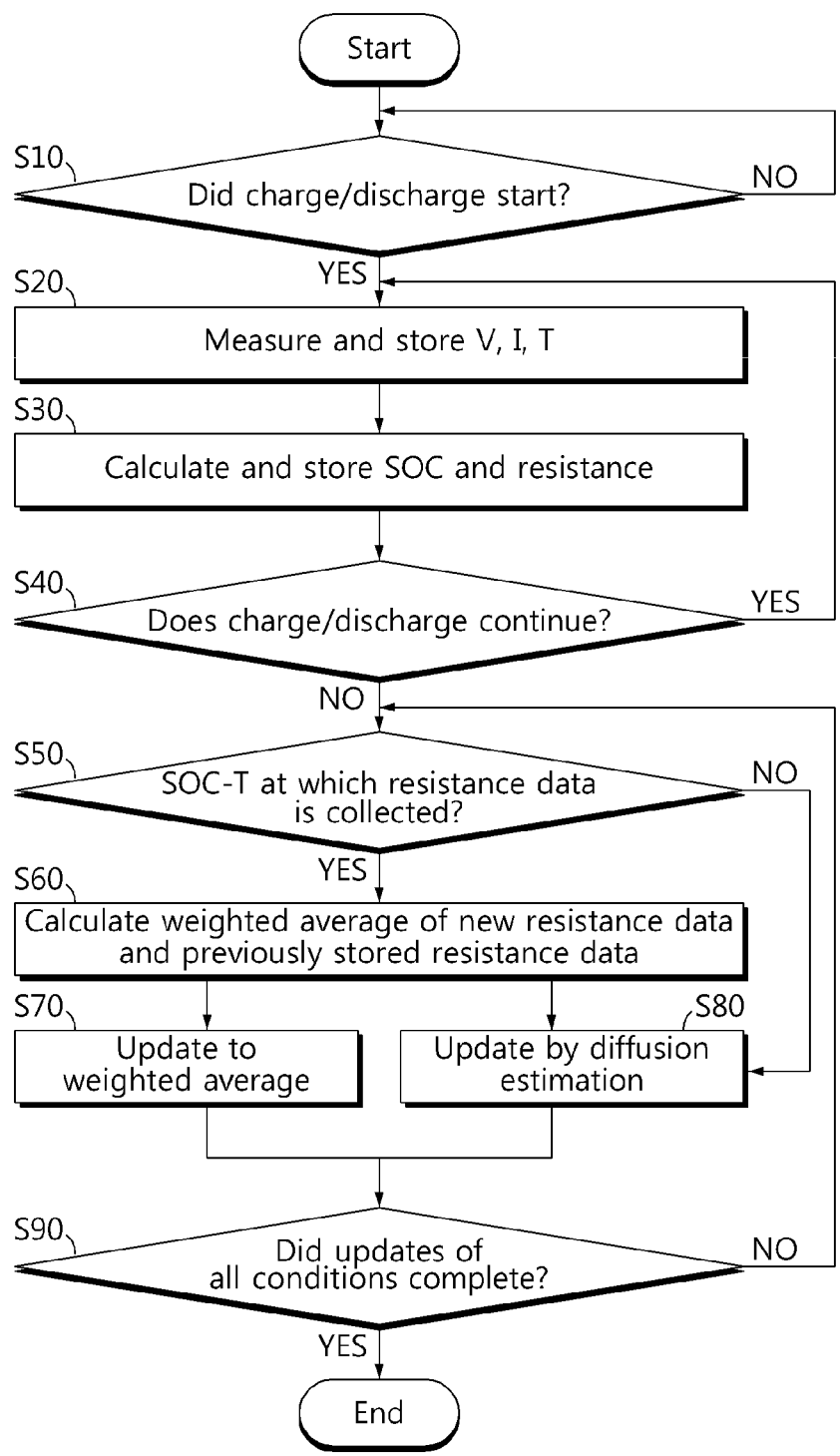
FIG. 3 is a flowchart showing a battery resistance estimation method according to an embodiment of the present disclosure.

FIG. 3 is a flowchart showing a battery resistance estimation method according to an embodiment of the present disclosure.

First, the control unit 120 checks if charge/discharge of the battery B started by referring to the measured current of the battery B stored in the memory unit 110 (S10).

When charge/discharge started, the control unit 120 measures the voltage, current and temperature of the battery B by controlling the voltage measuring unit 130, the current measuring unit 140 and the temperature measuring unit 150, and stores the measured voltage, the measured current and the measured temperature in the memory unit 110 (S20). The memory unit 110 may store a resistance lookup table in which resistance data is recorded according to the SOC-T condition of the battery B.

Subsequently, the resistance accumulation calculation unit 122 of the control unit 120 calculates SOC and resistance from the value stored in the memory unit 110, and accumulates and stores in the memory unit 110 by the SOC-T condition (S30). The control unit 120 may periodically determine the SOC of the battery B by the current integration method by referring to the measured current stored in the memory unit 110. The resistance may be calculated from dV/dI.

Subsequently, the control unit 120 checks if charge/discharge of the battery B continues (S40). The control unit 120 may determine if charge/discharge of the battery B continues by measuring the magnitude of the charge or discharge current of the battery B through the current measuring unit 140.

S20 and S30 are performed repeatedly on a periodic basis while charge/discharge of the battery B continues.

On the contrary, when charge/discharge of the battery B stops, for example, in the case of key off of the battery, the resistance data update unit 124 calculates a weighted average between new resistance data, namely, one of an average of resistance data stored in the memory unit 110 for each SOC-T condition, an average of maximum and minimum and the maximum, and previously stored resistance data (S60). A detailed description of weighted average calculation is the same as the foregoing description, and the weight used here is pre-stored in the memory unit 110. In this instance, SOC-T condition in which resistance data for calculating a weighted average is not collected is skipped. That is, it is determined beforehand as to whether or not it is SOC-T condition in which resistance data for calculating a weighted average is not collected (S50), and S60 is only performed in SOC-T condition in which resistance data is collected.

Subsequently, the resistance data update unit 124 updates the resistance data stored in the memory unit 110 for each SOC-T condition to the weighted average (S70). For a condition determined to be SOC-T condition in which resistance data is not collected in S50, update is performed by diffusion estimation from the estimated resistance of the adjacent condition obtained in S60 using the interpolation method or the extrapolation method (S80).

The control unit 120 may store the resistance estimated in S60, S70 and S80 in the memory unit 110, transmit it to the external device through the communication interface 160, or estimate other parameter such as the output or SOH of the battery B using the estimated resistance.

The control unit 120 determines if the above-described resistance data updates are performed for all SOC-T conditions (S90), and when updates are determined to have completed for all conditions, terminates the resistance estimation process according to the present disclosure.

At least one of the control logics illustrated in FIG. 3 may be combined, and the combined control logics may be written in computer-readable coding systems and stored in computer-readable recording media. The recording media is not limited to a particular type and includes any type that can be accessed by the processor included in the computer. For example, the recording media may include at least one selected from the group consisting of ROM, RAM, register, CD-ROM, magnetic tape, hard disk, floppy disk and an optical data recording device. Additionally, the coding systems may be modulated to a carrier signal and included in a communication carrier at a specific point in time, and may be stored and executed in computers connected via a network in distributed manner. Additionally, functional programs, codes and segments for implementing the combined control logics may be easily inferred by programs in the technical field pertaining to the present disclosure.

The battery resistance estimation apparatus according to the present disclosure may be included as part of a system called a BMS. Additionally, the BMS may be mounted in various types of electric-drive devices that can operate by electrical energy supplied from the battery B.

According to an aspect, the electric-drive device may be a mobile phone, a mobile computer device such as a laptop computer and a tablet computer, or a handheld multimedia device including a digital camera, a video camera and an audio/video player.

According to another aspect, the electric-drive device may be an electrically powered device that can move by electricity such as an electric vehicle, a hybrid electric vehicle, an electric bike, an electric motorcycle, an electric locomotive, an electric ship and an electric aircraft, or a power tool including a motor such as an electric drill and an electric grinder.

According to still another aspect, the electric-drive device may be a large-capacity energy storage system installed in a power grid to store renewable energy or redundant power, or an uninterruptible power system to supply power to various types of information communication devices including a server computer or a mobile communication device in an emergent situation such as blackout.

In describing various embodiments of the present disclosure, components designated by '~ unit' should be understood as elements which are classified functionally rather than physically. Accordingly, each component may be selectively combined with other component, or may be divided into subcomponents for efficient execution of control logic(s). However, it is obvious to those skilled in the art that even though the components are combined or divided, if the sameness of functions can be acknowledged, the combined or divided components should be construed as being in the scope of the present disclosure.

While the present disclosure has been hereinabove described with regard to a limited number of embodiments and drawings, the present disclosure is not limited thereto and it should be understood that various modifications and changes may be made by those skilled in the art within the technical aspects of the present disclosure and the equivalent scope of the appended claims.

What is claimed is:

1. A battery resistance estimation apparatus, comprising:
 a memory unit configured to store a resistance lookup table in which resistance data is recorded according to a state of charge-temperature (SOC-T) condition of a battery; and
 a control unit comprising:
 a resistance accumulation calculation unit configured to:
  measure I-V data while the battery is charged/discharged;
  calculate resistance by $dV/dI$ repeatedly on a periodic basis; and
  store the resistance in the memory unit, the resistance being accumulated and stored by the SOC-T condition; and
 a resistance data update unit configured to:
  calculate a weighted average of new resistance data and previously stored resistance data; and
  update resistance data corresponding to a corresponding SOC-T condition to the weighted average, the new resistance data being one of:
 an average of the resistance data stored in the memory unit by the SOC-T condition, an average of a maximum and a minimum of the resistance data, and the maximum of the resistance data.

2. The battery resistance estimation apparatus according to claim 1, wherein the resistance data update unit is further configured to update the resistance data by an interpolation or extrapolation method using a weighted average of resistance data calculated in an SOC-T condition adjacent to an SOC-T condition in which resistance data to calculate a weighted average is not collected.

3. The battery resistance estimation apparatus according to claim 2, wherein:
 the resistance data update unit is further configured to allocate and store a flag value by the SOC-T condition; and
 the flag value is used to identify whether the resistance data stored by the SOC-T condition is resistance data calculated in real time or resistance data estimated by the interpolation or extrapolation method.

4. The battery resistance estimation apparatus according to claim 1, wherein, as a difference between the new resistance data and the previously stored resistance data increases, a weight assigned to the new resistance data to calculate the weighted average increases.

5. A battery resistance estimation method, comprising:
(a) storing a resistance lookup table in a memory unit, the resistance lookup table recording resistance data according to a state of charge-temperature (SOC-T) condition of a battery;
(b) measuring I-V data while the battery is charged/discharged, calculating resistance by dV/dI repeatedly on a periodic basis, and storing the resistance in the memory unit, the resistance being accumulated and stored by the SOC-T condition;
(c) calculating a weighted average between new resistance data and previously stored resistance data, the new resistance data being one of an average of the resistance data stored in the memory unit by the SOC-T condition, an average of a maximum and a minimum of the resistance data, and the maximum of the resistance data; and
(d) updating the resistance data stored in the memory unit by the SOC-T condition to the weighted average.

6. The battery resistance estimation method according to claim 5, wherein operation (d) comprises updating the resistance data by an interpolation or extrapolation method using a weighted average of resistance data calculated in an SOC-T condition adjacent to an SOC-T condition in which resistance data to calculate a weighted average is not collected.

7. The battery resistance estimation method according to claim 6, wherein:
operation (d) comprises allocating and storing a flag value by the SOC-T condition; and
the flag value is used to identify whether the resistance data stored by the SOC-T condition is resistance data calculated in real time or resistance data estimated by the interpolation or extrapolation method.

8. The battery resistance estimation method according to claim 5, wherein, in operation (c), as a difference between the new resistance data and the previously stored resistance data increases, a weight assigned to the new resistance data to calculate the weighted average increases.

9. A battery management system comprising the battery resistance estimation apparatus according to claim 1.

10. A computer-readable recording medium having stored thereon a program for performing the battery resistance estimation method according to claim 5.

* * * * *